United States Patent

Keller et al.

[11] Patent Number: 6,069,087
[45] Date of Patent: May 30, 2000

[54] HIGHLY SELECTIVE DRY ETCHING PROCESS

[75] Inventors: David J. Keller, Boise; Barbara L. Casey, Meridian, both of Id.

[73] Assignees: Micron Technology, Inc., Boise, Id.; Applied Materials, Inc., Santa Clara, Calif.

[21] Appl. No.: 09/139,764

[22] Filed: Aug. 25, 1998

[51] Int. Cl.$^7$ .............................................. H01L 21/3065
[52] U.S. Cl. .......................... 438/706; 723/724; 723/743; 723/744
[58] Field of Search ................... 438/723, 724, 438/743, 744, 706

[56] References Cited

U.S. PATENT DOCUMENTS

| | | | |
|---|---|---|---|
| 4,511,430 | 4/1985 | Chen et al. | 438/723 |
| 4,529,476 | 7/1985 | Kawamoto et al. | 438/724 |
| 4,687,543 | 8/1987 | Bowker . | |
| 4,793,897 | 12/1988 | Dunfield et al. . | |
| 5,269,879 | 12/1993 | Rhoades et al. | 738/694 |
| 5,286,344 | 2/1994 | Blalock et al. | 738/723 |
| 5,644,153 | 7/1997 | Keller . | |
| 5,658,425 | 8/1997 | Halman et al. | 438/620 |
| 5,662,770 | 9/1997 | Donohoe . | |
| 5,700,580 | 12/1997 | Becker et al. . | |
| 5,756,216 | 5/1998 | Becker et al. . | |
| 5,786,276 | 7/1998 | Brooks et al. | 438/724 |
| 5,814,563 | 9/1998 | Ding et al. | 438/714 |
| 5,880,036 | 3/1999 | Becker et al. | 438/740 |

OTHER PUBLICATIONS

T.D. Mantei, High Density Sources for Plasma Etching, J. Appl. Phys. 69, 1991, pp. 137–156.

*Primary Examiner*—Felisa Hiteshew
*Assistant Examiner*—Lynette T. Umez-Eronini
*Attorney, Agent, or Firm*—Dickstein Shapiro Morin & Oshinsky LLP

[57] ABSTRACT

A plasma-enhanced method of selectively etching silicon dielectrics, such as silicon nitride, silicon oxide, silicon oxynitride, or silicon oxime relative to photoresist in a single step. A combination of a fluorocarbon selectivity agent such as difluoromethane, and a fluorocarbon etchant gas such as carbon tetrafluoride or pentafluoroethane, is used as the source gas for the plasma etch. The source gas concentration is within the range of approximately 1:2 to 2:1 selectivity agent to etchant gas, and the resultant plasma etches silicon dielectric at a rate approximately four times as fast as photoresist. The process is particularly useful for the etching of silicon dielectric spacers, or silicon nitride layers in the initial stages of a LOCOS process.

65 Claims, No Drawings

HIGHLY SELECTIVE DRY ETCHING PROCESS

FIELD OF THE INVENTION

The present invention relates to the fabrication of semiconductor devices and more particularly to a method for dry selective etching of silicon dielectric features in such devices.

BACKGROUND OF THE INVENTION

Silicon dielectric films, such as silicon nitride or silicon oxide films, have multiple uses in semiconductor device and integrated circuit designs. Silicon oxide ($SiO_2$) is commonly used in semiconductor devices as a passivating material to provide physical and chemical protection to underlying circuit devices and components, as an insulation layer, and as a protective layer during fabrication processes. Silicon nitride ($Si_3N_4$) ("nitride") is commonly used during the fabrication of integrated circuits to provide physical and chemical protection to underlying circuit devices and components. The protective qualities of nitride include moisture resistance, hardness, high dielectric strength, and resistance to oxidation.

An important use of nitride is as a protective layer in LOCal Oxidation of Silicon (LOCOS) processes, which are used to create field oxide areas that isolate device islands on a semiconductor substrate. During the LOCOS process, a layer of nitride is first deposited on a silicon substrate, followed by the deposition of a photoresist layer on top of the nitride. Photolithography combined with selective etching is used to precisely replicate the photoresist pattern in the nitride without etching the overlying photoresist layer. The patterned nitride layer is then used as a mask for the thermal oxidation of the substrate.

LOCOS and other fabrication processes require the use of an etching process that etches silicon dielectric material faster than photoresist material. Etching processes may be either wet etches or dry etches. Wet etches, also called chemical etches, are undesirable for selective silicon dielectric-to-photoresist etching for two reasons: (1) wet processes are difficult to integrate into automated fabrication lines; and (2) wet etching of silicon dielectric requires high temperatures that damage the photoresist layer. Dry etch processes, i.e., etching processes that use gases as the primary etching medium, are preferred formost silicon dielectric etching applications because of their ease of use.

A major disadvantage of dry etching processes is their generally poor selectivity and lack of etch uniformity. Photoresist selectivity is a critical consideration, because of the thin photoresist layers used to define submicron geometries, and the use of stacked layers in many devices. In addition, although a slight amount of overetch is desirable to ensure that all material to be removed has in fact been removed, the complicated structures and high aspect rations typical of high-density devices often result in non-uniform etches that have overetched in smaller areas while underetching larger areas.

Typical dry etching processes attempt to increase the dielectric-to-photoresist selectivity of dry etches by optimizing the etching gas formula, adjusting the overall etch rate, or performing multiple etching steps utilizing different etching gases. For example, it is known to use a two-step process with a first plasma etching step using a fluorine gas, and a second ion bombardment step using a mixture of $NF_3$ and HBr at high pressure. These known processes have typically achieved at most a 1:1 nitride-to-photoresist etching ratio, and depending on the process parameters, may fail to achieve more than a 1:2 ratio.

There is needed, therefore, a dry etching process for use in semiconductor fabrication that is highly selective for silicon dielectric as compared to photoresist material. Also needed is a selective etching process that requires only one etching step.

SUMMARY OF THE INVENTION

The present invention provides a highly selective dry etching process that etches silicon dielectrics such as silicon nitride or silicon oxide approximately four times faster than it etches typical photoresist materials. The method of the present invention is a one-step etching process in which a structure having a silicon dielectric layer to be etched is exposed to a plasma formed from a mixture of fluorocarbon gases. One of the fluorocarbon gases acts as a polymer-forming selectivity agent, and a second fluorocarbon gas acts as a primary etchant by providing fluorine ions to the etching process. The gases are used at a predetermined ratio within the range of one-half to two parts selectivity agent per part etchant gas (1:2 to 2:1 ratio), and preferably are used at a 1:1 ratio.

Preferably the selectivity agent is a hydrofluorocarbon such as difluoromethane, and the primary etchant is a fluorocarbon with a high fluorine-carbon ratio such as pentafluoroethane or carbon tetrafluoride. Most preferably the selectivity agent is difluoromethane and the primary etchant is carbon tetrafluoride.

The process is an efficient one-step process which increases repeatability, decreases material costs, and enhances operator control. Additional advantages and features of the present invention will be apparent from the following detailed description and drawings which illustrate preferred embodiments of the invention.

DETAILED DESCRIPTION OF THE PREFERRED EMBODIMENT

In the following detailed description, reference is made to various specific embodiments in which the invention may be practiced. These embodiments are described in sufficient detail to enable those skilled in the art to practice the invention, and it is to be understood that other embodiments may be utilized and that structural, logical and electrical changes may be made without departing from the spirit and scope of the present invention.

The terms "wafer" or "substrate" used in the following description include any semiconductor-based structure having an exposed silicon surface in which to form the structure of this invention. Wafer and substrate are to be understood as including silicon-on-insulator, doped and undoped semiconductors, epitaxial layers of silicon supported by a base semiconductor foundation, and other semiconductor structures. Furthermore, when reference is made to a wafer or substrate in the following description, previous process steps may have been utilized to forms regions or junctions in the base semiconductor structure or foundation.

The term "part" is used to indicate one of several equal units of which the gaseous mixtures used in the present invention are comprised. Because all gases are used at identical pressures and temperatures, the term part is used instead of other terminology (e.g., moles) to underscore the importance of using the gases in particular ratios as opposed to in particular amounts. The term "silicon dielectric" is used to indicate a silicon-based dielectric material such as silicon nitride or other silicon-based dielectrics with similar chemical characteristics, such as silicon oxide, silicon oxynitride, silicon oxime, and ONO (oxide-nitride-oxide) materials. The following detailed description is, therefore, not to be taken in a limiting sense, and the scope of the present invention is defined by the appended claims.

The present invention is a plasma etching process which uses an etching gas mixture as the source gas mixture to form a plasma that etches silicon dielectric at a much faster rate than it etches photoresist material, and does so with controlled anisotropy. The etching gas mixture comprises at least two fluorocarbon compounds at a ratio that maintains high etch selectivity with good etch rate. Preferred ratios, as described in more detail below, enable the selective etching of silicon dielectric at a rate approximately four times as great as the rate of etching the photoresist material.

The process may be used for any application in which selective etching of silicon dielectric with respect to photoresist material is desired. For example, the process is especially useful for the etching of nitride in a LOCOS process, which requires precise etching of nitride in combination with a high selectivity for nitride. Another use of the process is the selective removal of silicon dielectric spacers or caps abutting devices in an integrated circuit. In addition, the process may be used in non-integrated circuit applications in which silicon dielectric must be preferentially etched in comparison to photoresist materials.

Preferred etching gas formulas are mixtures of two fluorocarbons, such as difluoromethane ($CH_2F_2$) with carbon tetrafluoride ($CF_4$), or difluoromethane with pentafluoroethane ($C_2HF_5$). The first fluorocarbon ($CH_2F_2$) acts as a selectivity agent, and the second fluorocarbon serves as the primary etchant by providing fluorine ions for the etching process. Both the selectivity agent and the primary etchant provide fluorine ions to the plasma, but the selectivity agent reacts to form a fluorine-containing polymer, while the primary etchant produces free fluorine ions. Because the polymer-forming mechanism appears to control the selectivity of the etch, the polymer-forming fluorocarbon is referred to herein as the selectivity agent. The second fluorocarbon is called the primary etchant because it acts as the primary fluorine ion donor to the plasma.

The chemistry of the process is not entirely understood, and while not wishing to be bound by theory, it is currently believed that the selectivity of the etch is achieved by the formation of a passivating fluorine polymer (e.g., polytetrafluoroethylene) on the surface of the photoresist layer that protects it from attack by fluorine ions. This polymer layer is most likely in dynamic equilibrium (constantly being formed and etched away) at the surface of the photoresist layer so that it is sufficient to inhibit etching of the layer. The second fluorocarbon ($CF_4$ or $C_2HF_5$) is referred to as the primary etchant because the dielectric etch rate is proportional to the rate of flow of this fluorocarbon into the processing chamber.

The etching gases are preferably used at ratios which achieve highly selective dielectric-to-photoresist etching. A selective etch is achieved when using ratios of the selectivity and primary etchant gases within the range of one-half part selectivity agent per one part primary etchant gas (1:2 ratio) to two parts selectivity agent per one part primary etchant gas (2:1 ratio). The etching process is carried out in a plasma rector at a predetermined pressure. The size of the reactor determines the volume of gases to be used. For example, a reaction occurring in a single-wafer chamber would utilize a much smaller volume of gases than would a reaction occurring in a multi-wafer reaction chamber. Therefore, the exact volume of the gases is not critical to the process of the present invention.

Ratios lower than 1:2 are generally less desirable, because of low dielectric selectivity relative to photoresist, and ratios higher than 2:1 may tend to result in microloading in some applications. Microloading is a change in the local etch rate due to differing polymer deposition rates in relatively large areas compared to relatively small areas, which results in a fast etch rate in relatively large areas and a slow etch rate in relatively small areas. Preferably equal parts of the selectivity agent and the primary etchant gas are used (a 1:1 ratio) to maximize selectivity. Use of a 1:1 ratio has achieved an etch of silicon dielectric at a rate that is four times as fast as the etch of photoresist.

An inert gas such as helium or neon may be added to the plasma source gas to dilute the etching gases, and to enhance the uniformity of the etching process. A preferred diluent gas is helium, because it reduces faceting of the surface being etched. Similar effects may be achieved by using other gases, such as neon or argon, although helium is preferred.

The process may be carried out in a high density plasma (HDP) reactor as an enhanced reactive ion etch. A reactive ion etch is a combination of chemical plasma etching, in which a plasma etches by chemically reacting with the substrate, and ion beam etching, which is a physical process using high energy ions to bombard the wafer in order to etch it. An explanation of plasma etching techniques may be found in U.S. Pat. No. 5,662,770, entitled "Method and Apparatus for Improving Etch Uniformity in Remote Source Plasma Reactors with Powered Wafer Chucks," and in T. D. Mantei, "High Density Sources for Plasma Etching", Plasma Processing of Semiconductors, pages 137–56 (1997).

An example etching process comprises securing a wafer or integrated circuit structure having a silicon nitride layer and a photoresist layer to the chuck in the processing chamber of the reactor, and flowing the etching gas mixture into the reactor at a rate of approximately 40 to 120 standard cubic centimeters per minute (sccm) to form a plasma (glow discharge) over the wafer. The diluent gas is also flowed into the reactor at a rate of approximately 40 to 140 sccm. Preferred pressure is in the range of 5 to 15 mTorr, the preferred source power is in the range of approximately 500 to 1000 watts, and the preferred bias power is in the range of approximately 200 to 600 watts. The ratio of the different fluorocarbons in the etching gas mixture is maintained by regulating the flow of the fluorocarbons into the processing chamber. An example process using 20 sccm of a selectivity agent such as difluoromethane ($CH_2F_2$) would preferably also use 20 sccm of the etchant gas, e.g., 20 sccm carbon tetrafluoride ($CF_4$). The amount of diluent gas may be varied in a manner known in the art to achieve the desired dilution effect.

As can be seen by the embodiments described herein, the present invention encompasses processes of selectively etching silicon dielectric relative to photoresist materials in a single etching step. A mixture of at least one fluorocarbon selectivity agent such as difluoromethane with at least one fluorocarbon etchant gas such as carbon tetrafluoride is used to form a plasma to etch silicon dielectric selectively relative to photoresist and in a directional (anisotropic) manner.

The above description illustrates preferred embodiments which achieve the objects, features and advantages of the present invention. It is not intended that the present invention be limited to the illustrated embodiments. Any modification of the present invention which comes within the spirit and scope of the following claims should be considered part of the present invention.

What is claimed as new and desired to be protected by Letters Patent of the is United States is:

1. A method for etching silicon dielectric selectively relative to a photoresist layer, comprising the steps of:
    providing a wafer having a silicon dielectric layer and a photoresist layer; and
    exposing the wafer to a plasma formed from at least two fluorocarbon gases, wherein a first fluorocarbon gas acts as a selectivity agent and a second fluorocarbon gas acts as primary etchant; wherein said second fluorocarbon gas is selected from the group consisting of $CF_4$ and $C_2HF_5$.

2. The method of claim 1, wherein the silicon dielectric layer is a layer of silicon nitride.

3. The method of claim 1, wherein the silicon dielectric layer is a layer of silicon oxide.

4. The method of claim 1, wherein the silicon dielectric layer is a layer of silicon oxime.

5. The method of claim 1, wherein the silicon dielectric layer is a layer of silicon oxynitride.

6. The method of claim 1, wherein the silicon dielectric layer is an ONO layer.

7. The method of claim 1, wherein the first fluorocarbon gas is difluoromethane.

8. The method of claim 1, wherein the second fluorocarbon gas is pentafluoroethane.

9. The method of claim 8, wherein the first fluorocarbon gas is difluoromethane.

10. The method of claim 1, wherein the second fluorocarbon gas is carbon tetrafluoride.

11. The method of claim 10, wherein the first fluorocarbon gas is difluoromethane.

12. The method of claim 1, wherein the step of exposing the wafer to the plasma is performed at a pressure within the range of approximately 1 to 20 mTorr.

13. The method of claim 1, wherein the step of exposing the wafer to the plasma is performed at a pressure within the range of approximately 5 to 15 mTorr.

14. The method of claim 1, wherein the mixture further comprises a diluent gas.

15. The method of claim 14, wherein the diluent gas is selected from the group consisting of helium, neon, and argon.

16. The method of claim 1, wherein the plasma is formed from one part of the second fluorocarbon gas, and approximately one-half to two parts of the first fluorocarbon gas.

17. The method of claim 1, wherein the plasma is formed from one part of the first fluorocarbon gas, and approximately one part of the second fluorocarbon gas.

18. The method of claim 17, wherein the first fluorocarbon gas is difluoromethane and the second fluorocarbon gas is pentafluoroethane.

19. The method of claim 17, wherein the first fluorocarbon gas is difluoromethane and the second fluorocarbon gas is carbon tetrafluoride.

20. The method of claim 1, wherein the step of exposing the wafer to the plasma further comprises performing a reactive ion etch of the silicon dielectric layer.

21. The method of claim 1, wherein the step of exposing the wafer to the plasma further comprises performing a high density plasma etch of the silicon dielectric layer.

22. A method for etching silicon dielectric selectively relative to a photoresist layer, comprising the steps of:
    providing a reduced atmosphere reaction chamber;
    providing a silicon wafer having a silicon dielectric layer and a photoresist layer in said reaction layer;
    forming a plasma from at least two fluorocarbon gases, wherein a first fluorocarbon gas acts as a selectivity agent and a second fluorocarbon gas acts as a primary etchant, said second fluorocarbon gas being selected from the group consisting of $CF_4$ and $C_2HF_5$; and
    exposing the silicon wafer to said plasma.

23. The method of claim 22, wherein the silicon dielectric layer is a layer of material selected from the group consisting of silicon nitride, silicon oxide, silicon oxynitride, and silicon oxime.

24. The method of claim 22, wherein the reduced atmosphere comprises a pressure within the range of approximately 1 to 20 mTorr.

25. The method of claim 22, wherein the plasma is further formed from a diluent gas.

26. The method of claim 22, wherein the plasma is formed from one part of the second fluorocarbon gas, and approximately one-half to two parts of the first fluorocarbon gas.

27. The method of claim 22, wherein the plasma is formed from one part of the first fluorocarbon gas, and approximately one part of the second fluorocarbon gas.

28. The method of claim 22, wherein the first fluorocarbon gas is difluoromethane and the second fluorocarbon gas is pentafluoroethane.

29. The method of claim 22, wherein the first fluorocarbon gas is difluoromethane and the second fluorocarbon gas is carbon tetrafluoride.

30. The method of claim 22, wherein the step of exposing the silicon wafer to the plasma further comprises performing a reactive ion etch of the silicon dielectric layer.

31. The method of claim 22, wherein the step of exposing the silicon wafer to the plasma further comprises performing a high density plasma etch of the silicon dielectric layer.

32. A method for etching silicon dielectric selectively relative to a photoresist layer, comprising the steps of:
    providing a silicon wafer having a silicon dielectric layer and a photoresist layer; and
    exposing the silicon wafer to a plasma formed from a gaseous mixture, wherein said gaseous mixture consists essentially of a fluorocarbon selectivity agent gas and a fluorocarbon primary etchant gas, wherein said primary etchant gas is $CF_4$ or $C_2HF_5$. dielectric layer.

33. The method of claim 32, wherein the silicon dielectric layer is a layer of material selected from the group consisting of silicon nitride, silicon oxide, silicon oxynitride, and silicon oxime.

34. The method of claim 32, wherein the step of exposing the silicon wafer to the plasma further comprises performing a reactive ion etch of the silicon dielectric layer.

35. The method of claim 32, wherein the step of exposing the silicon wafer to the plasma further comprises performing a high density plasma etch of the silicon dielectric layer.

36. The method of claim 35, wherein the high density plasma etch is performed at a pressure within the range of approximately 1 to 20 mTorr.

37. The method of claim 32, wherein the gaseous mixture further includes a diluent gas introduced at a rate of approximately 40 to 140 sccm.

38. The method of claim 32, wherein the gaseous mixture comprises one part of the fluorocarbon selectivity agent gas, and approximately one part of the fluorocarbon primary etchant gas.

39. The method of claim 38, wherein the fluorocarbon selectivity agent gas is difluoromethane and the fluorocarbon primary etchant gas is pentafluoroethane.

40. The method of claim 38, wherein the fluorocarbon selectivity agent gas is difluoromethane and the fluorocarbon primary etchant gas is carbon tetrafluoride.

41. A method for etching a silicon dielectric selectively relative to photoresist layer, comprising the steps of:

provididing a silicon wafer having a silicon dielectric layer and a photoresist layer;

forming a plasma consisting essentially of one part $CF_4$ or $C_2HF_5$ primary etchant gas and approximately one-half to two parts difluoromethane; and exposing the silicon wafer to said plasma.

42. The method of claim 41, wherein the silicon dielectric layer is a layer of material selected from the group consisting of silicon nitride, silicon oxide, silicon oxynitride, and silicon oxime.

43. The method of claim 41, wherein the fluorocarbon primary etchant gas is pentafluoroethane.

44. The method of claim 41, wherein the fluorocarbon primary etchant gas is carbon tetrafluoride.

45. The method of claim 41, wherein the plasma further includes a diluent gas.

46. The method of claim 41, wherein the plasma consists essentially of one part fluorocarbon primary etchant gas and approximately one part difluoromethane.

47. A method for etching silicon nitride selectively relative to a photoresist layer in a LOCOS process, comprising the steps of:

providing a silicon wafer having a silicon nitride layer and a photoresist layer;

forming a patterned silicon nitride layer from said silicon nitride layer by exposing said silicon wafer to a plasma formed from a mixture of gases, wherein said mixture of gases consists essentially of one part fluorocarbon primary etchant gas and approximately one-half to two parts fluorocarbon selectivity agent gas, wherein said selectivity agent is selected from the group consisting of $CF_4$ and $C_2HF_5$; and forming areas of oxide on said silicon wafer using said patterned silicon nitride layer as a mask.

48. The method of claim 47, wherein the fluorocarbon selectivity agent gas is difluoromethane.

49. The method of claim 47, wherein the fluorocarbon primary etchant gas is pentafluoroethane.

50. The method of claim 47, wherein the fluorocarbon primary etchant gas is carbon tetrafluoride.

51. The method of claim 47, wherein the mixture of gases consists essentially of one part fluorocarbon primary etchant gas and approximately one part fluorocarbon selectivity agent gas.

52. The method of claim 47, wherein the mixture of gases further includes a diluent gas.

53. A method for etching a silicon dielectric selectively relative to a photoresist layer, comprising the steps of:

providing a silicon wafer having devices formed therein, wherein a silicon dielectric layer is formed over said devices;

forming a photoresist layer on said silicon wafer; and removing at least a portion of said silicon dielectric layer by exposing the silicon wafer to a plasma formed from one part $CF_4$ or $C_2HF_5$ primary etchant gas and approximately one-half to two parts fluorocarbon selectivity agent gas.

54. The method of claim 53, wherein the silicon dielectric layer is a layer of material selected from the group consisting of silicon nitride, silicon oxide, silicon oxynitride, and silicon oxime.

55. The method of claim 53, wherein the silicon dielectric layer comprises a cap on said devices.

56. The method of claim 53, wherein the silicon dielectric layer comprises protective spacers on said devices.

57. The method of claim 53, wherein the fluorocarbon primary etchant gas is carbon tetrafluoride and the fluorocarbon selectivity agent gas is difluoromethane.

58. A method for etching silicon dielectric selectively relative to a photoresist layer, comprising the steps of:

providing a reduced atmosphere reaction chamber;

providing a silicon wafer having a silicon dielectric layer and a photoresist layer in said reaction chamber;

forming a plasma from a gaseous mixture comprising one part carbon tetrafluoride and approximately one-half to two parts difluoromethane; and exposing the silicon wafer to said plasma.

59. The method of claim 58, wherein the silicon dielectric layer is a layer of material selected from the group consisting of silicon nitride, silicon oxide, silicon oxynitride, and silicon oxime.

60. The method of claim 58, wherein the reduced atmosphere comprises a pressure within the range of approximately 1 to 20 mTorr.

61. The method of claim 58, wherein the mixture further comprises a diluent gas.

62. The method of claim 58, wherein the gaseous mixture comprises one part carbon tetrafluoride and approximately one part difluoromethane.

63. The method of claim 58, wherein the step of exposing the silicon wafer to the plasma further comprises performing a high density plasma etch of the silicon dielectric layer.

64. A method for etching silicon dielectric selectively relative to a photoresist layer, comprising the steps of:

providing a reduced atmosphere reaction chamber;

providing a silicon wafer having a silicon dielectric layer and a photoresist layer in said reaction chamber;

forming a plasma from a gaseous mixture consisting essentially of approximately one part of difluoromethane and approximately one part pentafluoroethane; and exposing the silicon wafer to said plasma.

65. The method of claim 64, wherein the silicon dielectric layer is a layer of material selected from the group consisting of silicon nitride, silicon oxide, silicon oxynitride, and silicon oxime.

* * * * *

UNITED STATES PATENT AND TRADEMARK OFFICE
CERTIFICATE OF CORRECTION

PATENT NO.    : 6,069,087

DATED         : July 3, 2000

INVENTOR(S)   : David Keller et al.

It is certified that errors appear in the above-identified patent and that said Letters Patent is hereby corrected as shown below:

Column 1, line 45, "formost" should read --for most--

Column 2, line 35, delete "and drawings".

Signed and Sealed this

Third Day of April, 2001

Attest:

NICHOLAS P. GODICI

*Attesting Officer*      *Acting Director of the United States Patent and Trademark Office*